United States Patent
Kornilovich et al.

(10) Patent No.: US 7,803,712 B2
(45) Date of Patent: Sep. 28, 2010

(54) MULTILEVEL IMPRINT LITHOGRAPHY

(75) Inventors: Pavel Kornilovich, Corvallis, OR (US); Yong Chen, Redwood City, CA (US); Duncan Stewart, Menlo Park, CA (US); R. Stanley Williams, Redwood, CA (US); Philip J. Kuekes, Menlo Park, CA (US); Mehmet Fatih Yanik, Stanford, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 964 days.

(21) Appl. No.: 11/636,264

(22) Filed: Dec. 7, 2006

(65) Prior Publication Data

US 2010/0112809 A1 May 6, 2010

Related U.S. Application Data

(62) Division of application No. 10/453,329, filed on Jun. 2, 2003, now Pat. No. 7,256,435.

(51) Int. Cl.
*H01L 21/308* (2006.01)
(52) U.S. Cl. .............................. 438/691; 257/E21.575; 216/41
(58) Field of Classification Search ......... 438/691–692, 438/670, 666; 257/7, 208, E21.575; 216/41–43
See application file for complete search history.

(56) References Cited

U.S. PATENT DOCUMENTS

| | | | |
|---|---|---|---|
| 5,772,905 A | 6/1998 | Chou | |
| 6,256,767 B1 | 7/2001 | Kuekes et al. | |
| 6,294,450 B1 | 9/2001 | Chen et al. | |
| 6,527,870 B2 * | 3/2003 | Gotkis | 134/6 |
| 6,569,343 B1 * | 5/2003 | Suzuki et al. | 216/27 |
| 6,593,238 B1 * | 7/2003 | Haggart et al. | 438/691 |
| 6,599,836 B1 * | 7/2003 | Robinson et al. | 438/691 |
| 6,936,181 B2 * | 8/2005 | Bulthaup et al. | 216/44 |
| 6,943,117 B2 * | 9/2005 | Jeong et al. | 438/694 |

* cited by examiner

*Primary Examiner*—Nathan W Ha

(57) ABSTRACT

A mold with a protruding pattern is provided that is pressed into a thin polymer film via an imprinting process. Controlled connections between nanowires and microwires and other lithographically-made elements of electronic circuitry are provided. An imprint stamp is configured to form arrays of approximately parallel nanowires which have (1) micro dimensions in the X direction, (2) nano dimensions and nano spacing in the Y direction, and three or more distinct heights in the Z direction. The stamp thus formed can be used to connect specific individual nanowires to specific microscopic regions of microscopic wires or pads. The protruding pattern in the mold creates recesses in the thin polymer film, so the polymer layer acquires the reverse of the pattern on the mold. After the mold is removed, the film is processed such that the polymer pattern can be transferred on a metal/semiconductor pattern on the substrate.

15 Claims, 7 Drawing Sheets

MULTILEVEL IMPRINT LITHOGRAPHY

CROSS-REFERENCE TO RELATED APPLICATION

The present application is a divisional of application Ser. No. 10/453,329, filed Jun. 2, 2003 now U.S. Pat. No. 7,256,435, which is hereby incorporated by reference herein.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract Nos. DABT63-99-3-0003 and MDA972-01-3-0005 awarded by the Defense Advanced Research Projects Agency.

TECHNICAL FIELD

The present invention is related generally to nanometer-size electronic circuits, including molecular electronics, and, more particularly, to providing an interface between nanowires that comprise nanometer-size electronic circuits and microwires that comprise micron-size electronic circuits for efficient input/output of electrical signals.

BACKGROUND ART

The fabrication of nanometer-size electronic circuits with a high density of elements, high operational speed, and low manufacturing cost promises wide applications in future electronic devices. However, a major problem for nanoelectronics is to develop methods to fabricate an interface between nanowires and external microwires. Such interfaces are needed to efficiently input/output electrical signals from the external circuitry into the nanowires, selectively supply and distribute power, and provide internal interconnects between the nanowires. In conventional microelectronics, these problems are solved by means of selective interconnections of the electronic elements. An example is the multiplexer/demultiplexer interface shown in FIG. 1 and described in detail below. At the nanoscale, such interfaces require selective connection or disconnection between the nanowire and microwire at each cross point. As a result, the feature size along the microwire has to be comparable with the width of the nanowire and with the spacing between them, so it has to be of nanoscale itself. This is impossible to achieve by conventional photolithographic means with current mechanical accuracy for positioning one set of features over another.

One example of such interconnections between nanowires and microwires is disclosed in U.S. Pat. No. 6,256,767, entitled "Demultiplexer for a Molecular Wire Crossbar Network (MWCN Demux)", issued to Philip J. Kuekes et al on Jul. 3, 2001, and assigned to the same assignee as the present application, the contents of which are incorporated herein by reference. That patent discloses a randomly patterned demultiplexer for a two-dimensional array of a plurality of nanometer-scale switches (a molecular wire crossbar network), employing a bistable molecule as a connector species connecting pairs of crossed wires at each junction in the crossbar network. The present application is an improvement thereover in that, as disclosed and claimed herein, a method of fabricating a predetermined pattern of nanowire-microwire connections is provided, thereby reducing the number of microwires required and reducing the area occupied by the multiplexer/demultiplexer.

A need remains for a method of making arbitrary connections from specific microwires to specific nanowires.

DISCLOSURE OF INVENTION

In accordance with the embodiments disclosed herein, a mold with a protruding pattern is pressed into a thin polymer film via an imprinting process. Controlled connections between nanowires and microwires and other lithographically-made elements of electronic circuitry are provided. An imprint stamp is configured to form arrays of approximately parallel nanowires that have (1) micro dimensions (lengths) in the X direction, (2) nano dimensions (widths) and nano spacing in the Y direction, and three or more distinct heights in the Z direction at the nanometer scale. The stamp thus formed can be used to create a multilevel imprint in a polymer layer (or multi-layer) that will enable the connection of specific individual nanowires to specific microscopic regions of microscopic wires or pads.

The protruding pattern in the mold creates a recess in the thin polymer film, so the polymer layer acquires the reverse of the pattern on the mold. After the mold is removed, the film is processed such that the polymer in the recess area is removed, thereby exposing the underlying substrate. By further processing, the polymer pattern can be transferred into a metal/semiconductor pattern on the substrate, either by etching recesses into an underlying conductive film with the patterned polymer as a mask or by evaporating conductive material over the patterned polymer and removing anything not contacting the underlying substrate by lifting off the remaining polymer.

The controlled connections can be used, for example, (1) to make a demultiplexer, (2) to connect a nanowire array to microscopic wires or pads for the general input/output of signals or to deliver power at distinct voltages to specific nanowires, (3) to connect multiple nanowires to a single microwire to use that microwire as a bus for digital signals, (4) to connect nanowires to a two-dimensional array of micro scale pads which are formed as vias by a conventional lithographic process, or (5) to selectively connect nanowires that belong to different layers of nanowires.

The present invention solves the problem of selective connectivity between the external circuitry and nanowires. It also allows simultaneous fabrication of nanowires and multiplexers/demultiplexers. Thus, the present invention provides a technique for fabricating deterministic nanoscale integrated circuits, i.e., without recourse to random connections.

BEST MODES FOR CARRYING OUT THE INVENTION

Definitions

The term "micron-scale dimensions" refers to dimensions that range from 1 micrometer to a few micrometers in size.

The term "sub-micron scale dimensions" refers to dimensions that range from 1 micrometer down to 0.04 micrometers.

The term "nanometer scale dimensions" refers to dimensions that range from 0.1 nanometers to 40 nanometers (0.04 micrometers).

The term "microwire" refers to a wire with micron-scale or sub-micron scale width or diameter.

The term "nanowire" refers to a wire with nanometer-scale width or diameter.

The term "electrical contact" refers to an electrical connection between any two wires where that connection has 2-terminal ohmic or diode electrical character or 3-terminal transistor electrical character.

Figure 1:
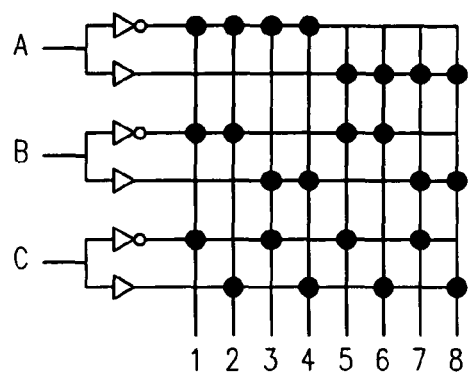
FIG. 1 is a schematic diagram of an example of a basic resistor-logic or diode-logic or transistor-logic demultiplexer circuit, in which three pairs of (horizontal) address wires that are interfaced to conventional circuitry are used to select one of eight nanowires (vertical); the round solid circles represent electrical (physical) contacts between the horizontal and vertical wires, and where there is no solid circle, there is no electrical or physical connection between the wires they are separated by an insulating layer.

Imprinting Process:

Turning first to FIG. 1, a schematic diagram of a basic demultiplexer circuit is shown. Eight nanowires (marked as 1-8) can be addressed by six communication wires, which are controlled pairwise by three logical inputs (marked as A, B, and C). The upper wire of each pair is biased with the voltage that represents the compliment of the input value (1 or 0), and the lower wire is biased with the voltage that represents the input value. Any combination of 0s and 1s on A, B, and C, uniquely addresses only one nanowire out of eight. For example, 1 on A, 1 on B, and 0 on C, will address the nanowire 6, and so on. In general, with such kind of multiplexer/demultiplexer circuits, 2n external microwires can interface with $2^n$ nanowires; in other words, adding one pair of communication wires in the demultiplexer doubles the number of nanowires that can be addressed. However, as mentioned above, the feature size along the communication wires (A, B, C) has to be comparable with the width of the nanowires and with the spacing between them, so it has to be of nanoscale itself, and this is presently impossible to achieve by conventional photolithographic means.

Figure 2:
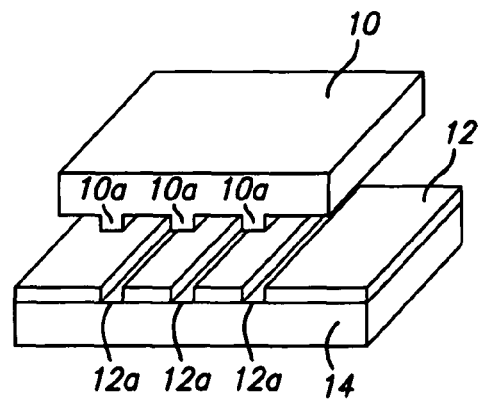
FIG. 2 is a perspective view, depicting a prior art imprinting process for which the features on the mold have only two levels.

Imprinting lithography is an effective, low-cost method to fabricate nanoscale circuits; see, e.g., U.S. Pat. No. 5,772,905, entitled "Nanoimprint Lithography", issued on Jun. 30, 1998, to S. Y Chou. FIG. 2 illustrates the imprinting process for a lift-off implementation, wherein a mold 10 with a protruding pattern 10a has been pressed into a thin polymer film 12. The polymer film 12 is supported on a substrate 14.

The protruding pattern 10a in the mold 10 creates a corresponding recess 12a in the thin polymer film 12 during pressing, so the polymer film acquires the reverse of the pattern on the mold. After the mold 10 is removed, the polymer film 12 is processed such that any polymer remaining in the recess area 12a is removed (in the case that the protrusions 10a did not fully contact the surface of the substrate 14), exposing corresponding portions of the underlying substrate 14. In the lift-off implementation here illustrated, a conductive thin film is deposited from the top direction, and the polymer portion 12b is dissolved in solvent, thereby removing the conductor deposited on the top of the polymer along with the polymer. Thus, only the conductor remaining in the recesses 12a will remain, thereby creating the desired pattern, e.g., conducting wires (not shown).

Figure 3A:
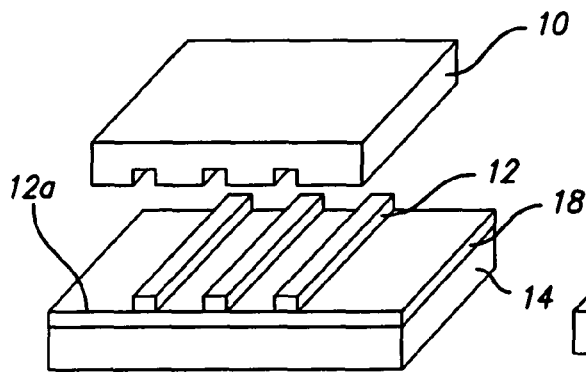
FIGS. 3a-3b are perspective views, depicting a prior art imprinting and etch process for which the features on the mold have only two levels.
Figure 3B:
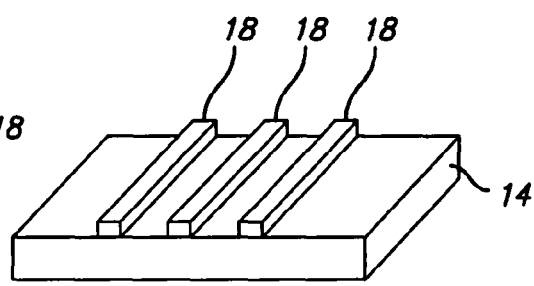

FIGS. 3a-3b illustrates the prior art imprinting process in the case of an etch implementation. As shown in FIG. 3a, substrate 14 supports a thin conductive film 18 and a thin polymer film 12. The mold 10 has been pressed into the polymer 12 to create recesses 12a, exposing portions of the conductive film 18. A subsequent etch process removes all exposed portions of the conductive film 18. Only portions of the film 18 still protected by the patterned polymer 12 remain.

The patterned polymer 12 can then be removed, e.g., dissolved in solvent, to leave the patterned conducting wires 18 in FIG. 3b.

In accordance with the present embodiments disclosed herein, a method for fabricating multiplexer/demultiplexer/interconnect interfaces is provided, using imprinting lithography technology. It is scalable down to the nanometer size and allows a simultaneous fabrication of the nanowire and multiplexer sections of the device.

A mold with a protruding pattern is pressed into a thin polymer film via an imprinting process. Controlled connections between nanowires and microwires and other lithographically-made elements of electronic circuitry are provided. The imprint stamp, or mold, is configured to form arrays of approximately parallel nanowires which have (1) micro dimensions in the X direction, (2) nano dimensions and nano spacing in the Y direction, and three or more distinct heights in the Z direction. The stamp thus formed can be used to create a multilevel imprint in a polymer layer (or multilayer) that will enable the connection of specific individual nanowires to specific microscopic regions of microscopic wires or pads.

Figure 4A:
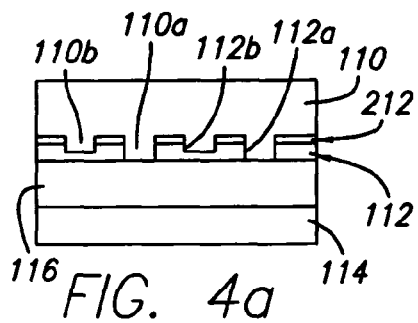
FIGS. 4a-4c are each a cross-sectional view, depicting one embodiment of the sequence of steps in fabricating a multiplexer-demultiplexer interface using a tri-level mold.
Figures 7, 8, 9:
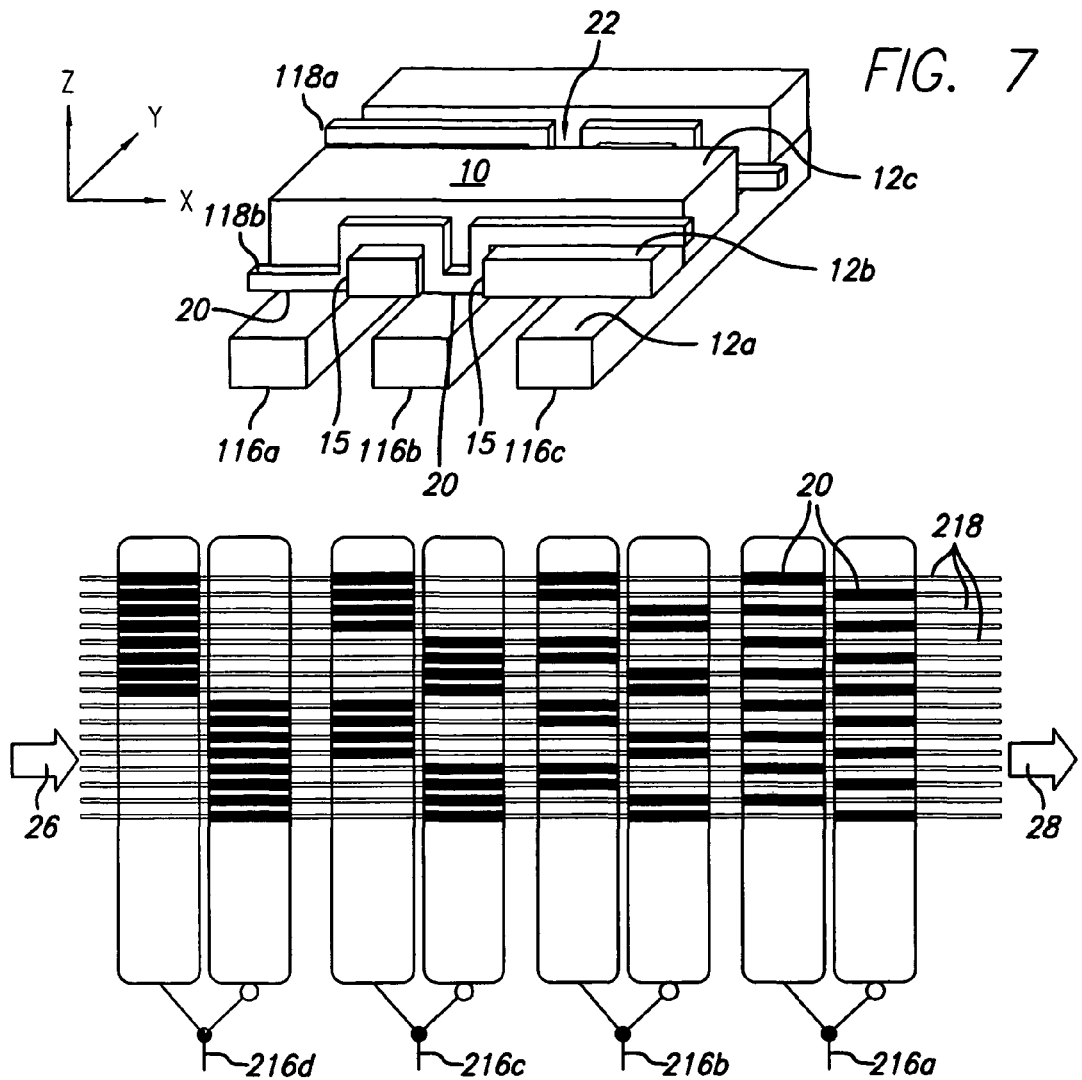
FIG. 7 depicts an example of a nanowire-microwire connection in accordance with embodiments taught herein, for which a nanowire makes physical contact with certain larger wires, but does not make physical or electrical contact with other larger wires because of the insulating barrier between the two.
FIG. 8 illustrates a conventional demultiplexing scheme, employed in the practice of the various embodiments taught herein, where the dark areas indicate that there is physical and electrical contact between an upper and lower wire, and the absence of a dark area represents that the upper and lower wires are not in physical and electrical contact, i.e., they are separated by an insulating barrier.
FIG. 9 shows an embodiment depicting electrical connection of several nanowires to a microwire (represented by dark areas on center microwire) that does not extend outside the nanowire area of the nanowire array, which may be used for connecting a specific set of nanowires to each other or to some circuit element that lies under the plane of the larger wires (e.g., the wire shown represents a via from a lower layer of circuitry)

Whereas the protruding, wire-like regions 10a on an imprinting mold 10 are of the same height in the prior art mold shown in FIG. 2, on the multilevel imprint mold, variable heights are provided in the multiplexer/demultiplexer area, as shown in FIGS. 4a and 7. Specifically with reference to FIG. 4a, a higher region 110a of the mold 110 will make a correspondingly deeper recession 112a in the polymer thin films 112, 212. Technologically, it is better to use double-layer polymer thin films 112, 212 in some cases.

One example of the formation of wires is now described with reference to FIGS. 4a-4b, involving a lift-off process. Other examples of the formation of wires are described below.

Shown in FIG. 4a is a substrate 114 supporting a communication microwire 116. It is to this communication wire 116 that electrical contact will or will not be made in fabricating a multiplexer/demultiplexer such as shown in FIG. 1. The protrusions 110a and 110b can have heights ranging from 1 to 500 nm, with protrusion 110a about 0.1 to 100 nm higher than protrusion 110b.

In actuality, a plurality of communication microwires 116 is formed on the substrate 114, generally aligned parallel to each other. The formation of such communication microwires 116 is conventional and does not form a part of this invention. The communication wires 116 typically comprise a metal, such as aluminum, platinum, or a metallic silicide. Alternatively, single crystal or polycrystalline silicon, doped to an appropriate level, may be used as the communication wires 116.

After the mold 110 is removed, the polymer in the deeper recess areas is removed, thereby exposing the underlying communication microwire 116. However, the polymer in the shallower recess areas will not be completely removed, therefore the underlying communication wire 116 will not be exposed in those areas.

Figure 4B:
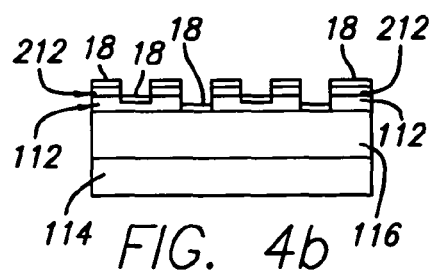

Next, metal 18 is blanket-deposited on top of the entire structure (FIG. 4b). Examples of suitable metals include those metals, metallic silicides, and silicon (doped) listed above. During the following lift-off, polymer thin film 212 is dissolved in a solvent, but polymer thin film 112 remains intact. (This process relies on specifically selected pair of polymers so that the solvent only dissolves polymer 212 but not 112; the selection of such pairs of polymers and the appropriate solvent is well-known. For example, polymer thin film 212 can be PMMA (poly(methyl methacrylate)), which can be dissolved in acetone solvent; polymer thin film 112 can be polyimide, which does not dissolve in acetone.)

Figure 4C:
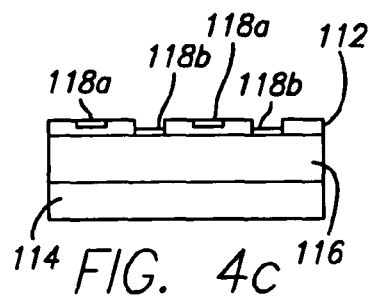
Figure 5A:
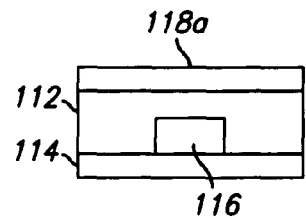
FIGS. 5a-5b are each a cross-sectional view, taken normal to the view of FIGS. 3a-3c, depicting the resulting configurations resulting in electrical non-contact, i.e., there is a thin insulating film between upper and lower wires (FIG. 5a) and electrical contact, i.e., there is a direct physical contact between the upper and lower wires (FIG. 5b)
Figure 5B:
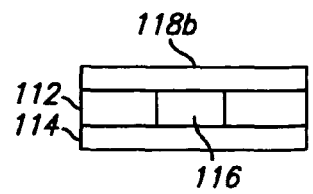

After the lift-off, the nanowires are fabricated in the circuits (not shown). In the multiplexer/demultiplexer area, the nanowires 118a in the shallower recess area do not make electrical contact with the communication wire 116 (see FIGS. 4c and 5a), while the nanowires 118b in the deeper recess area do make electrical contact with the communication wire 116 (FIGS. 4c and 5b). The nanowire circuit and multiplexer/demultiplexer are defined simultaneously.

Essentially, in the lift-off process, the required substrate consists of a relatively thick insulating material 114 topped by a deterministic array of large microwires 116. The process consists of imprinting a multi-level mold 110 into a multiple layer soft lithographic resist 112, 212 to create multi-level relief. Material deposited on top of the resist layer follows the relief pattern to form nanowires 118. Excess material between the nanowires on the topmost resist surface is removed by dissolution of the supporting resist layer immediately below. Electrical contact between the nanowires 118 and microwires 116 occurs at all extreme projecting surfaces 110a of the imprint mold.

The relief of the nanowires 118a, 118b formed is related to the height of the protrusions 110, 110b, and is in the range of 1 to 500 nm. The nanowires 118a, 118b have a thickness of about 1 to 1000 nm.

The nanowires 118a, 118b are formed generally parallel to each other, and cross over the communication microwires 116 at a non-zero angle, typically orthogonal thereto, as shown in FIG. 1. It will be appreciated by those skilled in this art that the dots at the various intersections in FIG. 1 are equivalent to those areas in which nanowires 118b make electrical contact with the communication microwires 116 and that the intersections not having dots in FIG. 1 are equivalent to those areas in which nanowires 118a do not make electrical contact with the communication microwires 116.

Figure 6A:
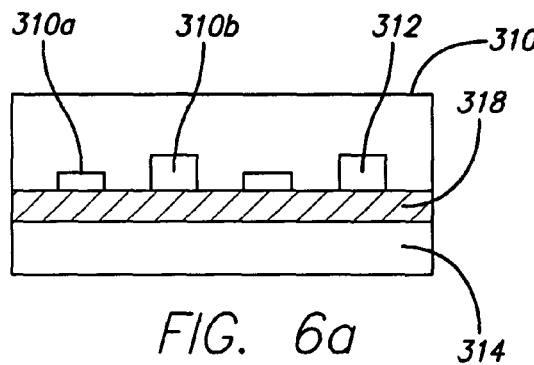
FIGS. 6a-6e illustrate another embodiment of the formation of electrically connected sets of nanowires and microwires, involving an etch process.
Figure 6B:
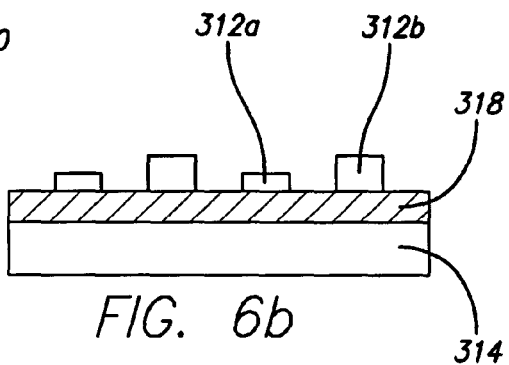
Figure 6C:
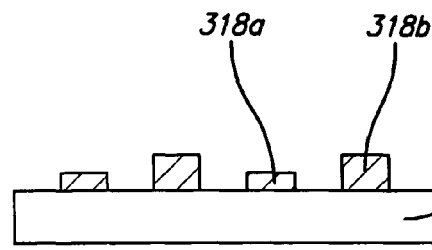
Figure 6D:
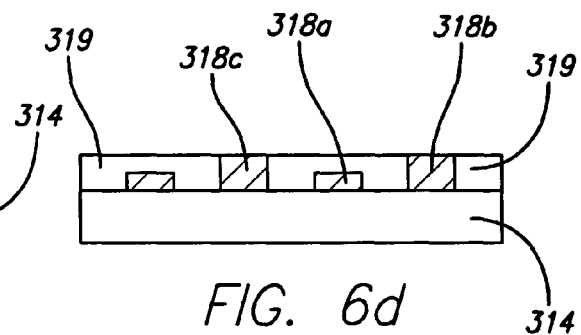
Figure 6E:
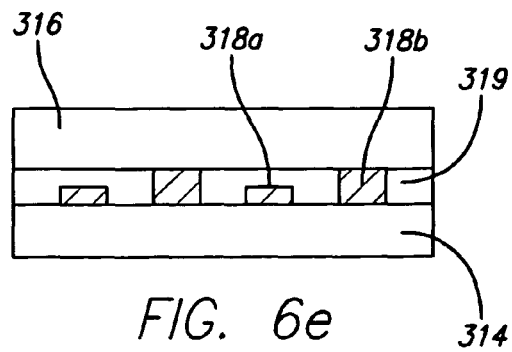

A second example of the formation of wires is now described with reference to FIGS. 6a-6e, involving an etch process. The required substrate consists of a thick insulating material 314 topped by a thin layer of device material 318, metal or semiconductor. The process consists of imprinting a multi-level mold 310 with recesses of a first depth 310b and a second depth 310a into a single or multiple layer soft lithographic resist 312 to create wire-like polymer protrusions with multi-level relief, portions of each protrusion having either a first height 312b or a second height 312a (FIGS. 6a-6b). Single or multiple etch steps, either dry, possibly reactive, ion etches or wet chemical etches then transfer the multi-level relief from the resist down into the thin device material layer 318 (FIG. 6c). At this stage the continuous device material layer 318 has been patterned into nanowires with multi-level thicknesses or heights 318b and 318a above the thick insulating substrate. Planarization with insulating material 319 at the level of the topmost device material 318c then results in a flat surface with isolated exposed portions 318c of the mostly buried nanowires (FIG. 6d). These isolated exposed portions 318c are then contacted by large scale microwires 316 deposited and patterned by conventional lithographic techniques (FIG. 6e). Insulating material 319 can be formed by several methods including vapor phase regrowth or electrochemical regrowth of the insulating substrate 314, or blanket deposition of similar or different insulating material. Planarization can be achieved by chemical and/or mechanical polishing.

The present teachings provide a means for fabricating a multiplexer/demultiplexer/interconnect by imprinting, simplifying the manufacturing processes, and allowing the multiplexer/demultiplexer/interconnect and nanocircuits to be fabricated simultaneously. Therefore, it solves the connection/communication problem for nanoscale circuits including molecular electronic circuits.

Applications

The teachings herein provide a general method of making controlled connections between nanowires and microwires and other lithographically-made elements of electronic circuitry. The various embodiments create an imprint stamp to make systems of approximately parallel nanowires, which have micro dimensions in the X direction, nano dimensions and nano spacing in the Y direction, and three or more distinct heights in the Z direction. This stamp can be used to connect specific individual nanowires to specific microscopic regions of microscopic wires or pads; see FIG. 7.

As shown in FIG. 7, a three-level mold stamped into polymer 10 creates a three-dimensional landscape, comprising a first level 12a exposed through windows 15 that extend to the top surface of communication wires 116a, 116b, a second level 12b that defines the continuous nanowires 118a, 118b, and a third level 12c. Each groove at level 12b has its own set of windows 15 that expose microwires 116a-116c underneath the stamped polymer 10. After deposition of metal and liftoff (not shown), nanowires 118 are formed at level 12b, including following the contours at that level and into windows 15 that may be present. Nanowires 118 connect to microwires 116 only through windows 15 and make contact at locations 20. In this particular embodiment depicted in FIG. 7, nanowire 118b connects to microwires 116a and 116b but does not connect to microwire 116c. (The connection between microwire 116b and nanowire 118a is denoted 22, since it is hidden in the view shown in FIG. 7.)

An X-Y-Z coordinate system is depicted in conjunction with FIG. 7, wherein the mold, or imprint stamp, is configured to form arrays of approximately parallel nano-wires 118 which have (1) micro dimensions in the X direction (2) nano dimensions and nano spacing in the Y direction, and three or more distinct heights in the Z direction (three such heights are shown in FIG. 7).

(1) In one embodiment, the connection depicted in FIG. 7 may be used to make a demultiplexer; see FIG. 8. As shown in FIG. 8, each pair of communication wires 216a, 216b, 216c, and 216d, each on the order of micrometer size, divide a set of sixteen nanowires 218 in half, but in its own way, as illustrated, for example, by black areas 20 under the nanowires 218 where they electrically contact the communication wires 216. Open circles denote the logical operation NOT. As a result, any combination of 0s and 1s sent to 216a, 216b, 216c, and 216d selects one and only one nanowire 218. An external signal 26 is sent through all nanowires 218, but only the selected wire carries the signal to the nanowire circuit (not shown but denoted by arrow 28).

The nanowire circuit could be a nanowire-nanowire crossbar structure, such as disclosed in, for example, U.S. Pat. No. 6,128,214, entitled "Molecular Wire Crossbar Memory", issued on Oct. 3, 2000, to Philip J. Kuekes et al and assigned to the same assignee as the present application; the contents of U.S. Pat. No. 6,128,214 are incorporated herein by reference. Every intersection is a memory element (memory circuit), or a logic element (computer logic circuit). Accordingly, every nanowire circuit has to have at least two demultiplexers, one for X and another for Y arrays of nanowires. For the demultiplexer shown in FIG. 8, the microscopic wires 216 would be semiconductor (doped) or metal; the nanowires 218 would be metal or semiconductor. Electrical contact between the microwires and nanowires could have ohmic, diode or transistor character, with diode and transistor character most desirable for demultiplexer circuits.

The nanowire circuit could be a nanowire-nanowire crossbar structure, where every intersection is a nano-scale sensor or actuator element.

The nanowire circuit could consist of only one set of approximately parallel nanowires, possibly coated with chemical or biological functional groups, each nanowire acting as a sensor or actuator.

(2) In another embodiment, the connection depicted in FIG. 7 may also be used to connect a nanowire array to microscopic wires or pads for general input/output of signals or to deliver power at distinct voltages to specific nanowires (not shown).

(3) In yet another embodiment, multiple nanowires 318 may be connected to a single microwire 316b (and not to other microwires 316a, 316c) to use that microwire as a bus 30 for common signals; see FIG. 9. A short microwire 316b connects to selected nanowires 318, as illustrated by the black areas 20 under the nanowires where they electrically contact the short microwire.

Figure 10:
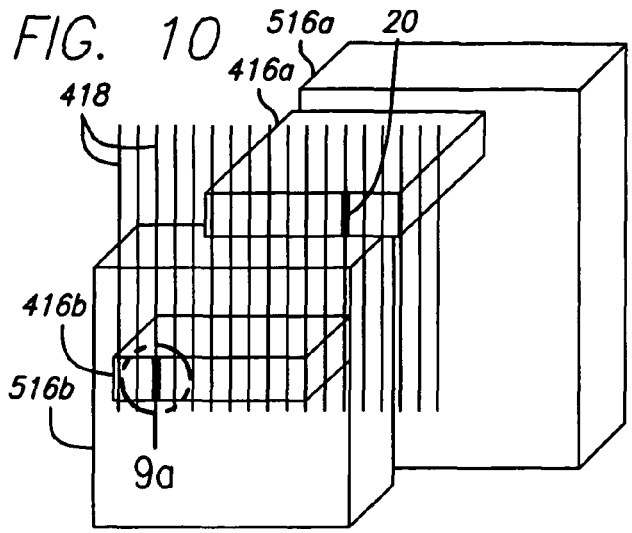
FIG. 10 illustrates selective connections between nanowires and microsized vias on two different levels; the nanowires are closest to the viewer, where a first microwire is below the nanowires and has a via that is used in this case to connect just one nanowire, and a second microwire is below the first microwire and has a via that is used to connect to a different nanowire.
Figure 10A:
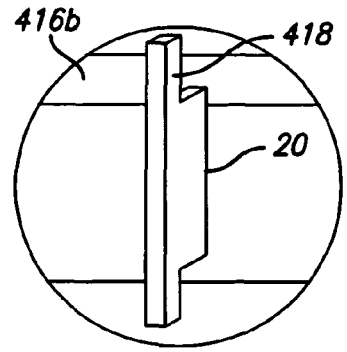
FIG. 10a is an enlargement of a portion of FIG. 10, depicting electrical contact between a nanowire and a microwire.

(4) In still another embodiment, nanowires 418 may be connected to a two-dimensional array of micro scale pads 416 which are formed as vias by a conventional lithographic process; see FIGS. 10 and 10a. This embodiment allows high-density connections to multiple layers of microwires 416a, 416b. Contact 20 is made between nanowires 418 and micro scale pads, or vias, 416, because nanocontact is at multiple levels. Microscopic vias 416 and microscopic wires, or conductive paths, 516 are made by conventional lithography. Microscopic vias 416a, 416b come out close enough to make electrical contact 20 with nanoscopic wires 418. Microscopic via 416b extends to a first layer of conductors 516b, while microscopic via 416a extends even deeper to a second layer of conductors 516a. In a multi-layer circuit, there could be a plurality of such conductor layers 516, connected to nanoscopic wires 418 by microscale vias 416. This is a mechanism for connecting nanowires arbitrarily deep through vias.

One essential issue is that microscopic conductors 516a, 516b are quite large compared to nanowires 418. If it is desired to make electrical connections 20, one would be limited by the number of connections that could be made. The vias 416 permit more connections, using deeper layers. (As an aside, if one had a region full of circuits, say 2-dimensional, and wanted to connect to the external world, one could enclose the circuits in a line. The lines from each circuit have to "escape" the enclosure. The use of vias 416 permits escape on multiple layers.) For an area N, the number of circuits is $N^2$, but only N lines allowed. But if there are N levels, then one can gain access to all circuits.

Figure 11:
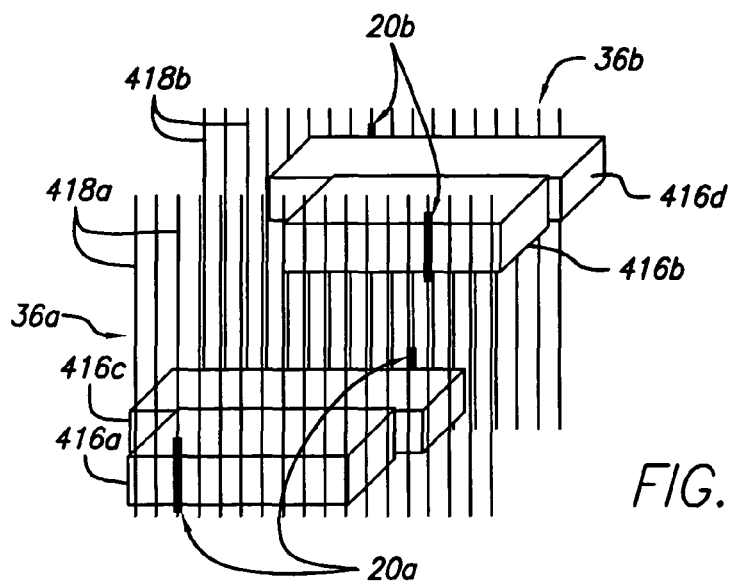
FIG. 11 illustrates two interconnects between different layers of nanowires, with certain vias allowing connection between one nanowire in each layer, and other vias allowing connection between two different nanowires in the layers.

A second essential value is the specific connections allowed by contacts 20. FIG. 11, discussed next, is a generalization of the bus idea to multiple planes; FIG. 10 shows how to do this.

(5) In yet another embodiment, the basic approach depicted in FIG. 7 can be used to selectively connect nanowires 418 that belong to different layers of nanowires. This can be done by connecting the wires from two neighboring nanowire layers 36a, 36b to microwires 416a, 416b that are sandwiched in between. This provides a method to connect different nanowire layers together and create three-dimensional nanowire networks and circuits; see FIG. 11. Nanowires 418a in an array 36a are selectively connected to vias 416a. Nanowires 418b in an array 36b are selectively connected to vias 416b. The vias 416a and 416b are connected between each other. As a result, specific connections of individual nanowires that belong to different levels is possible.

FIG. 11 is directed to connecting nanoscale arrays 36. A via 416 can be connected to a nanoarray 36, simply by considering the structure shown in FIG. 10 and connecting two such structures back-to-back. Nanowires 418a are in the foreground. Contact 20a is next closest. Via 416a is in front of via 416c. Via 416b is in the same plane as via 416a. Via 416b is in front of via 416d. The furthest plane contains nanowires 418b.

One can create a circuit using nanocrossbar technology and conventional microscale lithography. Shown here is one direction of crossbars, 418a. This gives conductivity between 418a and 418b, since the vias 416 are electrically conducting. Thus, one or more nanowires 418 can be connected to each other, in the same plane (which can also be done by the crossbar) or in different planes, using multiple distinct buses (416a-416c; 416b-416d). It is in principle possible to form a sandwich, stacking molecular crossbar circuits and permit them to talk with each other vertically, using an arbitrary, fixed pattern. This arrangement permits arbitrary routing, using electrical connections, without necessarily having direct physical connection, using microwires 416 in x and y directions. Electrical contact between the vias 416 and the nanowires 418 may have ohmic, diode or transistor character.

As will be appreciated by those skilled in this art, the teachings herein provide a method to fabricate complex connected integrated electronic circuits at the nanoscale.

Materials and Connections

The microwires and nanowires described herein may be metallic, semiconductor, or insulating, depending on the material used for their fabrication. They may alternatively be organic or molecular conductors. Consequently, the electrical connection between nanowires and microwires may be of ohmic, diode or transistor character. Alternatively, the connection may be insulating, for example, a tunnel barrier or anti-fuse designed to break down at a particular applied field. The teachings herein provide a method to make selective connections to a particular type of wires. For example, some nanowires may be connected only to metallic microwires while other nanowires are connected to semiconductor microwires. Or, the same nanowire may be connected to one or more metallic microwires and, at the same time, to one or more semiconductor microwires.

Figure 12:
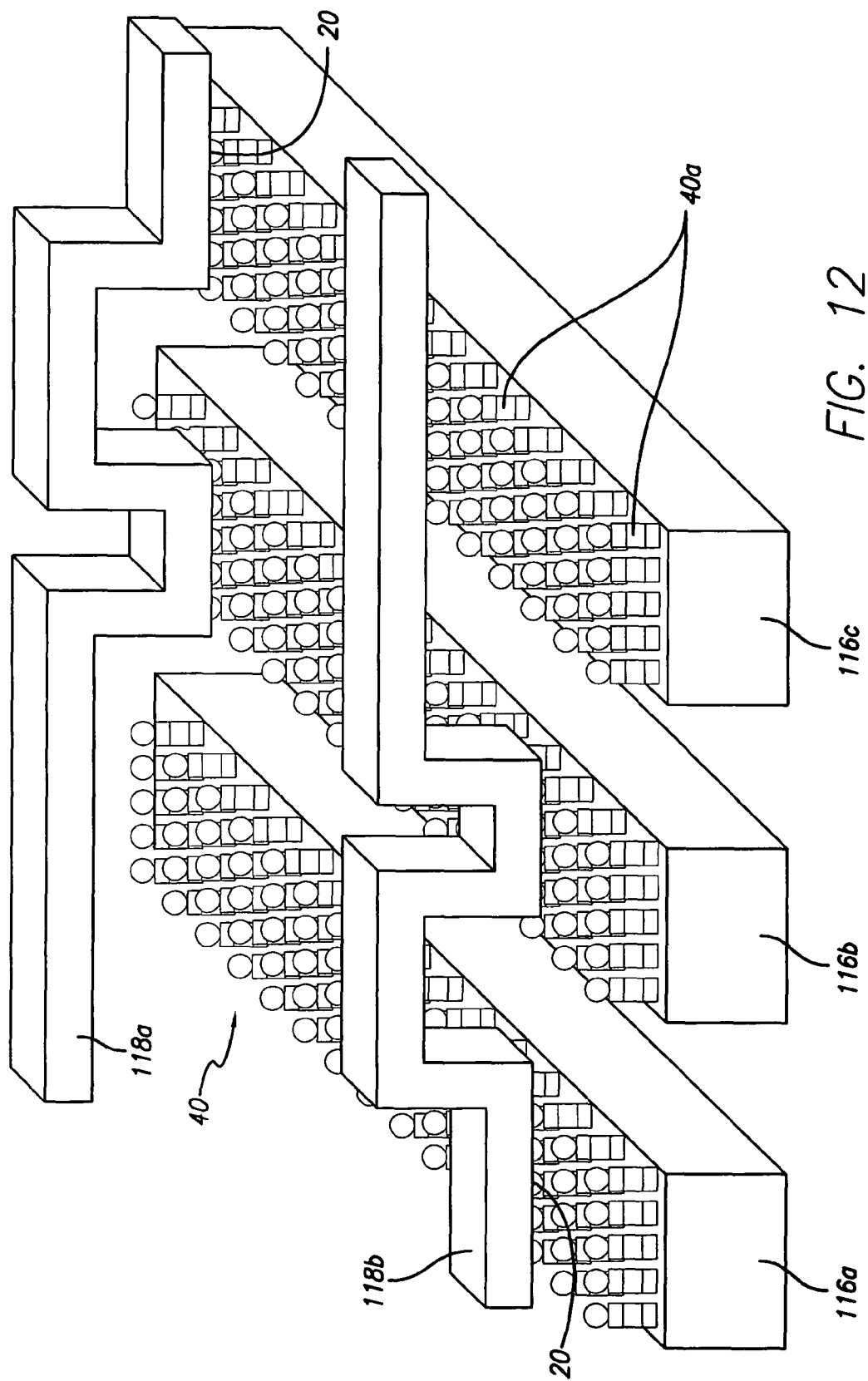
FIG. 12 is a perspective view, showing electrical contact of selected portions of nanowires to selected portions of microwires, with a switchable molecular film on the microwires.

Additionally, a molecular film may be placed between a microwire and a nanowire at the point of their contact. FIG. 12 depicts such an arrangement. Here, three microwires 116a-116c are shown, together with two nanowires 118a-118b. A molecular film 40, comprising a plurality of molecules 40a and formed on the surface of the microwires 116, is sandwiched by a nanowire 118, wherever it contacts a microwire 116. For example, nanowire 118a contacts the molecular film 40 on microwires 116b and 116c (but not on microwire 116a), whereas nanowire 118b contacts the molecular film 40 on microwires 116a and 116b (but not on microwire 116c).

The molecules 40a in the molecular film 40 may be passive or active electronic elements. As passive elements, they may facilitate a better electrical contact between the nanowire 118 and the microwire 116, or enhance the rectifying function or transistor function of the connection. As active elements, they may be multiple-state switches or transistors.

Similarly to molecules, other, substances may be, placed between nanowires 118 and microwires 116 in their contact regions 20. These may be single or multiple layers of metal, insulator, semiconductor, polymer, or nanoparticles. These may also be alloys, mixtures of nanoparticles of different kinds, as well as more complex composites.

3. Geometries

The present teachings disclose a fabrication sequence in which the microwires 116 are fabricated first and then nanowires 118 are imprinted and fabricated on top thereof. However, this sequence may be reversed. That is, nanowires 118 are imprinted first and then microwires 116 are fabricated on top of the nanowires.

Further, microwires 116 may be placed inside as well as outside the footprint of the nanowire arrays 36.

Figure 13:
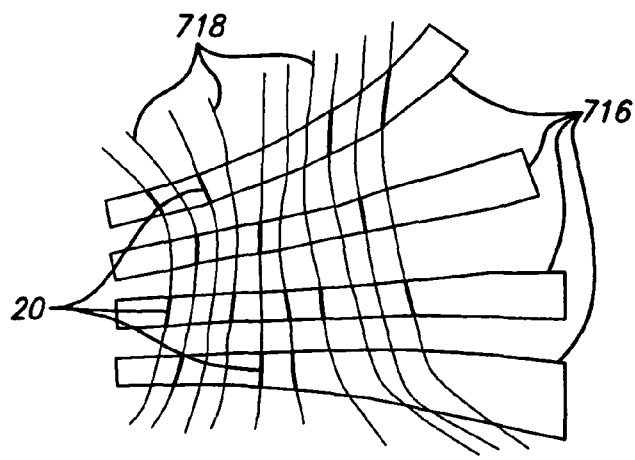
FIG. 13 illustrates a set of curved nanowires selectively connected to a set of irregularly shaped microwires or macropads.

Finally, according to the teachings of the various embodiments herein, connections may be made from microscale features 116 not only to straight nanowires 118, but also to systems of curvilinear approximately parallel nanowires; see FIG. 13. A system of curved nanowires 718, fabricated by imprinting, makes selected electrical connection to various lithographically fabricated microwires 716, which may or may not be curved.

4. Fabrication Methods

In one embodiment, a lift-off process may be used, as described above.

In another embodiment, an etch process may be used, as described above.

In yet another embodiment, a pattern for location of pre-fabricated nanowires may be used. The required substrate consists of a thick insulating material. The process consists of imprinting a multi-level mold into a multiple layer soft lithographic resist to create multi-level relief. Trenches formed in the resist are then used to guide deposition and alignment of pre-fabricated nanowires, for example carbon nanotubes. These nanowires 118 can contact microwires 116 below following the initial substrate preparation of the lift-off process, or can contact microwires above following the final steps of the etch process.

In a still further embodiment, a pattern for in-situ nanowire growth may be used. It is almost identical to the preceding pattern process, except that the relief trenches 112a, 112b formed in the resist 112 are then used to initiate in-situ growth of device material, for example silicon nanowires or carbon nanotubes. These nanowires can contact microwires below following the initial substrate preparation of the lift-off process, or can contact microwires above following the final steps of the etch process.

5. Mold Design

5a. Two-Level Molds

The prior art for two-level molds is described in U.S. Pat. No. 5,772,905, "Nanoimprint Lithography" by Stephen Y. Chou. That patent describes the process of creating a hard mold with two different feature heights and pressing that mold into a thin polymer film on top of a substrate. By controlling the temperature and pressure during the imprint process, an imprint is made into the polymer layer. This imprint can then be cleaned up by a light etching process, to remove excess polymer at the bottom of the imprint channels. The remaining polymer may then be used as an etch mask for further etching into the substrate to form channels, or it may be used as a deposition mask for metal or other deposited material.

5b. Three-Level Molds

The present teachings are directed to the fabrication of a hard mold in which there are features at three different levels in the mold. When this mold is pressed into a substrate, it will leave an impression with three different heights one at or very near the substrate surface, one at an intermediate height above the surface, and a third that is higher than the second. For the case in which the substrate is itself a thin metal film on an insulating substrate, etching this system with an appropriate anisotropic etch will result in a surface with two different wire heights. Furthermore, the height of a particular wire can alternate between two different heights if the thickness of the mold alternates.

5c. Four- (or More) Level Molds

This principle of creating molds with more than two levels can be extended to four or more level systems. Such a mold can lead to the formation of a surface that has wires with three or more thicknesses. Such a system may be useful for the creation of complex three dimensional circuits based on nanowires.

6. Mold Fabrication

There are many methods for creating multi-layer molds, some of which are discussed here. Most utilize a combination of techniques—some type of process to create a large number of nanometer-width features that will be the template for nanowires in the finished device, coupled with some other type of serial process that can be used to modify the template to add more levels and increase the complexity, and thus the information content, of the pattern.

6a. Superlattices

Creating extremely long parallel lines with a pitch in the sub 100 nm length range is extremely challenging for any lithographic process. One way to create a mold for imprinting such lines is to grow a superlattice of two materials, such as Si and SiGe alloys or GaAs and AlGaAs alloys. Well known and highly controlled methods can be used to grow atomically precise thicknesses of the two materials. When the wafer is cleaved perpendicular to the growth plane and then etched to preferentially remove one of the materials, an imprint mold with a large number of precisely parallel lines of predetermined width and height can be formed. To create the third level of features, this mold can be subsequently modified using locally focused etching or deposition techniques, to either remove or add material and create arbitrary patterns that cross over the parallel lines of the superlattice.

6b. Locally Focused Etching

A critical step in the process of the present invention is to fabricate a mold 110 with different protrusive heights 110a, 110b. One suitable method is to use a locally focused source, for example, a focused ion beam or a nano-scale scanning electrochemical probe, to etch the existing mold 110, for example, prefabricated using the superlattice method described above. After the nanowire mold 110 has been made, protrusions 110a can be selectively etched locally by the focused beam to produce protrusions 110b. An arbitrarily patterned multi-level mold can be created. The height change can be controlled by the etching conditions, e.g., by etching time. This focused etching method could also be used starting from a planar substrate to create the multi-level mold in its entirety.

6c. Locally Focused Deposition

Another suitable method comprises use of a locally focused source, for example a focused ion beam or a focused electron beam catalyzing chemical vapor deposition or a nano-scale scanning electrochemical probe, to selectively deposit material onto the existing mold 110. After the nanowire mold 110 has been made, for example with uniform protrusions 110b, the focused beam can be used to deposit additional material locally onto protrusions 110b to create higher protrusions 110a. An arbitrarily patterned multi-level mold can be created, with the relief height controlled by the deposition conditions, e.g., deposition time. The focused deposition technique could also be used starting from a planar substrate to create the multi-level mold in its entirety.

6d. Locally Focused Chemical Modification

Instead of directly etching or depositing material the locally focused source could be used to locally chemically modify the existing mold 110. Subsequent exposure to chemical deposition conditions can result in material depositing on the locally modified regions of the mold. Alternatively, chemical etch conditions could be used to result in removal of material from the locally modified regions of the mold. Both approaches can generate an arbitrarily patterned multi-level mold.

6e. Patterned Superlattices

Superlattices can be fabricated and subsequently patterned to create the multi-level mold as described above. Alternatively, patterning can be done during the superlattice fabrication. In this method, thin layers of two materials, "A" and "B", are grown on a substrate in alternative order. Material "A" etches in certain wet or dry chemical environments much slower than material "B". During deposition of material "A", certain areas of the layer are shadowed, leaving empty regions, which are then filled with material "B" during deposition of the next layer. These shadowed regions do not have to be nano-scale. Therefore, their size and exact locations could be controlled by conventional photolithographic processes. The pattern of shadowed regions could be made different and unique to different layers of material "A".

After depositing all the layers, the superlattice is cut in half through the shadowed regions of material "A". Then the side of the superlattice is exposed to the etch which removes material "B" from between the layers of material "A", as well as from the shadowed regions inside the layers of material "A". Hence, a unique pattern of protruding regions of material "A" is exposed on the side edge of the superlattice. The side of the superlattice can then be used as a mold. In this method, the width of nanowires is controlled by the thickness of layers "A". Therefore, the method is capable of producing multiplexers deep into the nano-scale. A similar scheme is disclosed and claimed in U.S. Pat. No. 6,294,450, using alternating layers of two dissimilar materials.

Figure 14A:
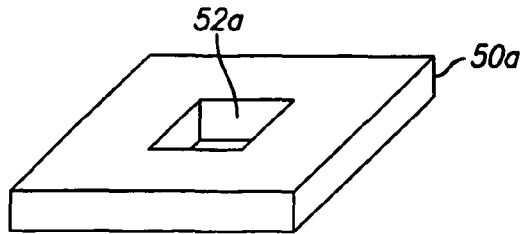
FIGS. 14a-14g illustrate a process for fabricating a three-level mold useful in the practice of the embodiments taught herein.

An example of how to form three layer molds is illustrated with reference to FIGS. 14a-14g. As shown in FIG. 14a, a first layer 50a of nanoscopic thickness is provided with a first opening 52a therethrough. The layer 50.a comprises a material having a first composition. The opening 52a has microscopic lateral dimensions.

Figure 14B:
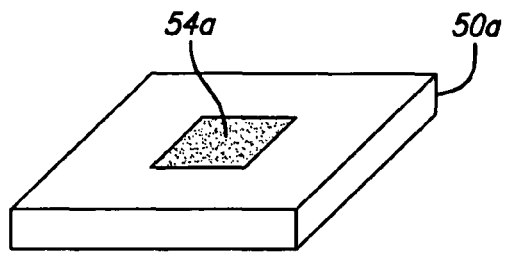

The opening 52a is next filled with a material 54a having a second composition, as shown in FIG. 14b.

Figure 14C:
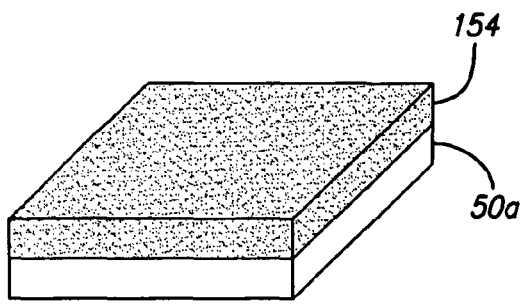

Next, as shown in FIG. 14c, a second layer 154 of material having the second composition is deposited on the first layer 50a. The second layer 154, like layer 50a, is also of nanoscopic thickness.

Figure 14D:
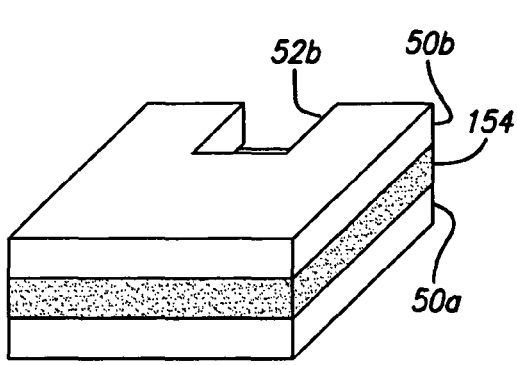

The process is continued by adding a third layer 50b of the first composition and forming a second opening 52b through that third layer, as shown in FIG. 14d. The second opening 52b is formed not over the first opening 52a, but laterally displaced from it. The third layer 50b, like the previous layers, is of nanoscopic thickness, while the opening 52b, like the opening 52a, has microscopic lateral dimensions.

Figure 14E:
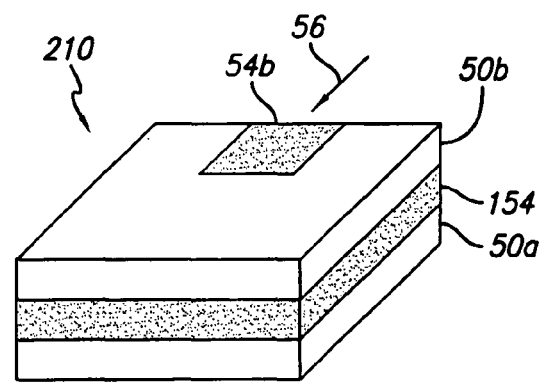

As above, the opening 52b is filled with a material 54b having the second composition, as shown in FIG. 14e.

Figure 14F:
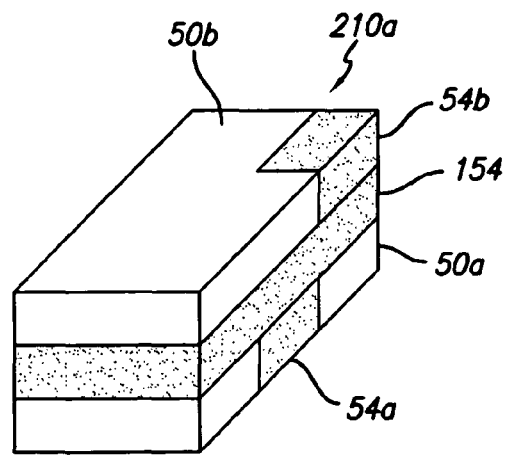

Next, the structure 210 is cut through the openings 52a, 52b along the line denoted 56, as shown in FIG. 14e, to produce the structure 210a shown in FIG. 14f, thereby exposing the interior of the structure 210, along with the material 54a, 54b in the openings 52a, 52b.

Figure 14G:
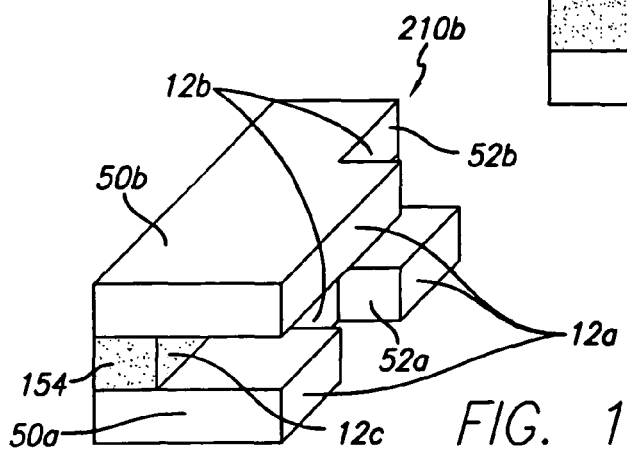

Finally, an etchant is selected that etches the second material faster than the first material, and the structure 210a is etched from the side, providing a suitable mold 210b having three levels, 12a, 12b, 12c, as shown in FIG. 14g.

6f. Superlattice with Nanoparticles

Figure 15A:
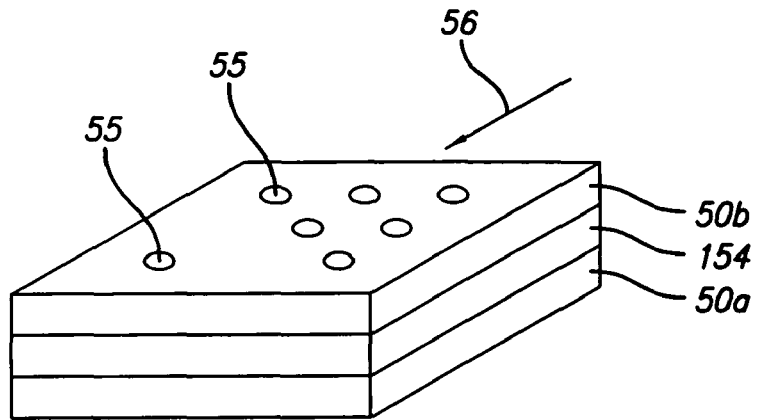
FIGS. 15a-15c illustrate a superlattice-with-nanoparticles process for fabricating a three-level mold useful in the practice of the embodiments taught herein.
Figure 15B:
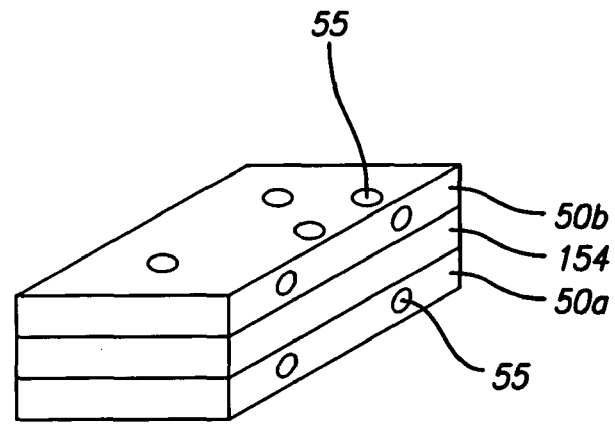
Figure 15C:
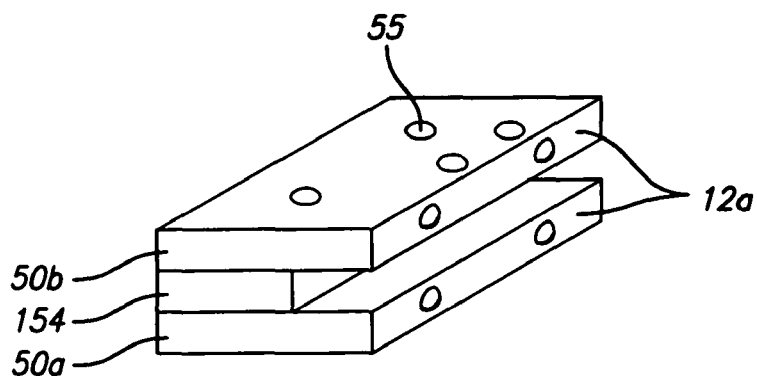

Alternatively, the patterned superlattice method of FIGS. 14a-g can be implemented with nano-scale particles. During fabrication of the superlattice, nanoparticles 55 are incorporated into the alternate layers 50, as indicated in FIG. 15a. The arrangement of nanoparticles in the plane 50 can be patterned deterministically, for example by lithographic or self-assembly methods. Cutting the superlattice perpendicular to the alternating planes 50, 154 then produces an edge with exposed nanoparticles 55 (FIG. 15b). Etching of the layers 154 produces a two-level mold as described above. The nanoparticle material is also chosen so as to have different etch characteristics than the layer 50. Subsequent etching of either the layers 50 or the nanoparticles 55 produces multi-level relief on the protruding surfaces 12a, shown in FIG. 15c. The nanoparticles 55 either protrude from the protruding surfaces 12a or are recessed therein, depending on the relative etch rates of the nanoparticles and the protruding surfaces.

The arrangement of nanoparticles may instead be patterned randomly, in which case successful implementation of a multiplexer function is more difficult but still possible, as disclosed in U.S. Pat. No. 6,256,767, entitled "Demultiplexer for a Molecular Wire Crossbar Network (MWCN Demux)", issued to Philip J. Kuekes et al on Jul. 3, 2001, and assigned to the same assignee as the present application, the contents of which are incorporated herein by reference.

6g. E-Beam Bilayer Resist

Another procedure for creating a three-layer mold is to deposit two different layers of electron beam resist on a substrate. Writing into this bilayer at one beam intensity will only expose the top layer of resist, while writing with a more intense beam current will expose both layers of resist. After developing and stripping the developed resist, one is left with a three layer system that can then be etched into the mold substrate by the appropriate anisotropic etch.

INDUSTRIAL APPLICABILITY

The method for making a multiplexer/demultiplexer in nanoscale circuits by an imprinting process is expected to find use in the fabrication of nanometer-size electronic circuits, including molecular and polymer electronic circuits.

What is claimed is:

1. A method of fabricating a pattern of approximately parallel nanowires which have (1) micro dimensions in the X direction, (2) nano dimensions and nano spacing in the Y direction, and at least three distinct heights in the Z direction, wherein said nanowires are formed by a lift-off process, said method comprising:

providing a substrate comprising an insulating portion and a layer of an array of microwires thereon, providing a polymer film supported on said substrate, with said polymer film formed on said layer of microwires;

forming a lithographic resist on said polymer film;

providing a mold having at least three levels of protruding patterns;

stamping said mold into said polymer film to form a multi-level relief, whereby portions of said protruding patterns penetrate to said layer of array of microwires, thereby exposing said layer, and whereby other portions of said protruding patterns penetrate below said lithographic resist into said polymer film to thereby expose portions of said polymer film, and whereby still other portions of said protruding patterns do not penetrate said lithographic resist;

blanket-depositing conductive material on said exposed portions of said layer of array of microwires, on said exposed portions of said polymer film, and on said lithographic resist not otherwise penetrated; and dissolving portions of said resist to remove conductive material thereon, leaving conductive material, comprising one set of said nanowires in contact with said exposed portions of said layer of array of nanowires and at least one additional set of nanowires supported above said layer of array of microwires by said polymer film to form conductive traces.

2. The method of claim 1 wherein said nanowires are formed by an etch process comprising:

providing said substrate comprising an insulating portion and a conducting layer thereon, with said polymer film formed on said conducting layer;

stamping said mold into said polymer film to form a multi-level relief;

etching said polymer film to transfer said multi-level relief in said lithographic resist down into said conducting layer to form nanowires with multi-level relief along their length;

planarizing with insulating material at the topmost conducting layer to leave said topmost conducting layer exposed; and electrically contacting said exposed topmost layer with patterned microwires.

3. The method of claim 1 wherein said nanowires are pre-fabricated and are located in pre-determined locations as follows:

providing said substrate comprising an insulating material;

forming a polymer film on said insulating substrate;

stamping said mold into said polymer film to form a multi-level relief, including trenches;

using said trenches formed in said polymer film to guide deposition and alignment of said pre-fabricated nanowires;

(1) whereby in the case where microwires are deposited on said insulating substrate prior to forming said polymer film thereon, windows in the polymer film opened by the furtherest protruding surface of the mold relief expose portions of said microwires for electrical contact by said pre-fabricated nanowires, or (2) whereby in the case where microwires are deposited on top of said nanowires, then an etch process is first implemented to transfer said multi-level relief into said substrate and said deposited nanowires then replicate said multi-level relief, and planarization with an insulating material then leaves deterministic exposed portions of said nanowires, and said microwires are patterned and formed on portions of said pre-fabricated nanowires, making electrical contact only to said exposed portions.

4. The method of claim 3 wherein in step (d), said trenches are used to initiate in-situ growth of device material.

5. The method of claim 1 wherein said pattern permits connecting specific individual nanowires to specific microscopic regions of microscopic wires or pads.

6. The method of claim 1 for forming controlled connections (1) to make a demultiplexer, (2) to connect a nanowire array to microscopic wires or pads for the general input/output of signals or to deliver power at distinct voltages to specific nanowires, (3) to connect multiple nanowires to a single microwire to use that microwire as a bus for digital signals, (4) to connect nanowires to a two-dimensional array of micro scale pads which are formed as vias by a conventional lithographic process, or (5) to selectively connect nanowires that belong to different layers of nanowires.

7. A method for making a multiplexer/demultiplexer in nanoscale circuits by an imprinting and lift-off process, said method comprising:
- providing a substrate with at least one bottom communication wire on a major surface thereof;
- forming a first polymer layer on said major surface of said substrate, said first polymer layer having a first thickness;
- forming a second polymer layer on said first polymer layer, said second polymer layer having a second thickness and capable of dissolving at a faster rate in a solvent than said first polymer;
- providing a mold having a plurality of wire-like protrusions, portions of each protrusion having either a first height or a second height, wherein said first height is greater than said second height, wherein said first height is equal to the total of said first and second thickness and wherein said second height is less than said second thickness;
- impressing said wire-like protrusions of said mold into said first and second polymer layers such that said first height penetrates said first and second polymers to said bottom communication wire to thereby create a plurality of shallow recesses and a plurality of deep recesses;
- blanket-depositing a metal layer on said second polymer and in said shallow and deep recesses;
- removing said second polymer and said metal layer thereon, thereby leaving metal in said shallow recesses that does not make electrical contact said bottom communication wire and leaving metal in said deep recesses that does make electrical contact with said bottom communication wire.

8. The method of claim 7 wherein said plurality of bottom communication wires are formed generally parallel to each other.

9. The method of claim 7 wherein said wires in both said first and second recesses are formed generally parallel to each other.

10. The method of claim 7 wherein said wires in both said first and second recesses have a height in a range of about 1 to 1000 nm and a width in a range of about 1 to 1000 nm.

11. The method of claim 7 wherein said mold is fabricated by using a focused ion beam to selectively etch said protrusions of said first and second heights.

12. A method for making a multiplexer/demultiplexer in nanoscale circuits by an imprinting and etch process, said method comprising:
- (a) providing a substrate with a major surface;
- (b) forming a conductive layer on said major surface of said substrate;
- (c) forming a polymer layer on said conductive layer, said polymer layer having a thickness;
- (d) providing a mold having a planar surface and a plurality of wire-like recesses, portions of each recess having either a first depth or a second depth, wherein said first depth is greater than said second depth, wherein said first depth is equal or greater than said polymer thickness and wherein said second depth is less than said polymer thickness;
- (e) impressing said mold into said polymer layer such that said planar surface penetrates said polymer to said conductive layer to thereby create a plurality of wire-like polymer protrusions with multi-level relief, portions of each protrusion having either a first height or a second height;
- (f) transferring the multi-level relief of said imprinted polymer layer into said conductive layer by single or multiple etch processes, to form conductive wires with multi-level relief, portions of each wire have a first height or a second height, wherein said first height is greater than said second height;
- (j) forming an insulating layer on top of said conductive wires by deposition or growth processes;
- (k) planarizing said insulating layer at the level of the topmost conductive wire portions of said first height, to leave a plurality of conductive wires covered by said insulating layer except exposed at those portions of said first height;
- (l) forming a plurality of upper communication wires supported by said planarized insulating layer, that make electrical contact to said lower conductive wires only at those portions of said first height not covered by said insulating layer.

13. The method of claim 12 wherein said plurality of bottom conductive wires are formed generally parallel to each other.

14. The method of claim 12 wherein said plurality of upper communication wires are formed generally parallel to each other.

15. The method of claim 12 wherein said bottom conductive wires have a height in a range of about 1 to 1000 nm and a width in a range of about 1 to 1000 nm.

* * * * *